US006581873B2

(12) United States Patent
McDermott

(10) Patent No.: US 6,581,873 B2
(45) Date of Patent: Jun. 24, 2003

(54) HYBRID WINGED AIRSHIP (DYNASTAT)

(76) Inventor: Patrick P. McDermott, 2411 Rocky Branch Rd., Vienna, VA (US) 22181

( * ) Notice: Subject to any disclaimer, the term of this patent is extended or adjusted under 35 U.S.C. 154(b) by 0 days.

(21) Appl. No.: 10/050,934

(22) Filed: Jan. 22, 2002

(65) Prior Publication Data

US 2002/0096599 A1 Jul. 25, 2002

Related U.S. Application Data

(60) Provisional application No. 60/262,364, filed on Jan. 19, 2001.

(51) Int. Cl.$^7$ ................................................ B64B 1/20
(52) U.S. Cl. ................................. 244/25; 244/24
(58) Field of Search ......................... 244/25, 24

(56) References Cited

U.S. PATENT DOCUMENTS

| | | | | |
|---|---|---|---|---|
| 1,033,186 A | * | 9/1912 | Merckens | 244/25 |
| 1,608,822 A | * | 11/1926 | Silver | 244/25 |
| 1,833,033 A | * | 11/1931 | Ortega | 244/25 |
| D158,736 S | * | 5/1950 | Frank | D12/323 |
| 3,180,588 A | * | 4/1965 | Fitzpatrick | 244/25 |
| 3,856,238 A | * | 12/1974 | Malvestuto, Jr. | 244/5 |
| 5,240,206 A | | 8/1993 | Omiya | |
| 5,383,627 A | * | 1/1995 | Bundo | 244/26 |
| 5,425,515 A | | 6/1995 | Hirose | |
| 5,518,205 A | * | 5/1996 | Wurst et al. | 244/58 |
| 6,142,414 A | * | 11/2000 | Doolittle | 244/25 |
| 6,471,159 B1 | * | 10/2002 | Bundo | 244/26 |

FOREIGN PATENT DOCUMENTS

| | | | | |
|---|---|---|---|---|
| EP | 0088806 A1 | * | 3/1982 | B62B/1/06 |
| FR | 2612878 A1 | * | 9/1988 | B64B/1/06 |
| GB | 2103588 A | * | 2/1983 | A47J/41/00 |

OTHER PUBLICATIONS

"High Altitude Airship", Lockheed Martin, Feb. 21, 2003, p. 1–3.*

* cited by examiner

Primary Examiner—Charles T. Jordan
Assistant Examiner—Stephen Holzen
(74) Attorney, Agent, or Firm—Siemens Patent Services, LC

(57) ABSTRACT

A winged hybrid airship (dynastat) combining the advantages of lighter-than-air (LTA) and heavier-than-air (HTA) aircrafts is disclosed. By combining the dynamic lift of low drag, high aspect ration airfoils (e.g., length over chord >10) with the static lift of low drag, laminar-airflow airships, a platform is formed which is capable of prolonged high altitude flight, maintaining station over a given point on the earth, carrying a payload of communications, reconnaissance or meteorological equipment. Solar collection cells and microwave antennas allow for recharging of on board batteries/fuel cells for powering both the airship and on board avionics computers and reconnaissance or meteorological equipment. An alternate embodiment, having strengthened structural members, is able to provide low altitude heavy cargo lift in remote regions regions or cross country transport of goods.

18 Claims, 13 Drawing Sheets

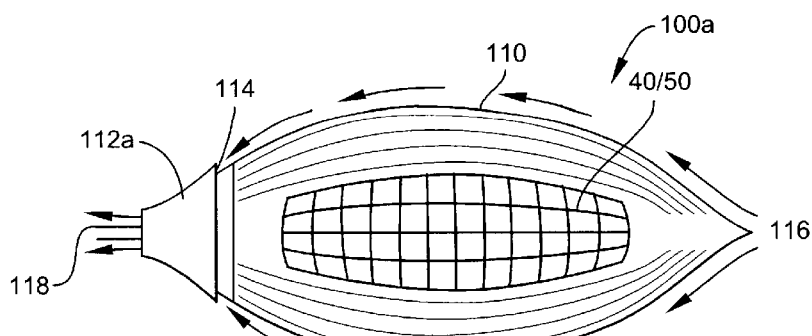
Fig. 3a
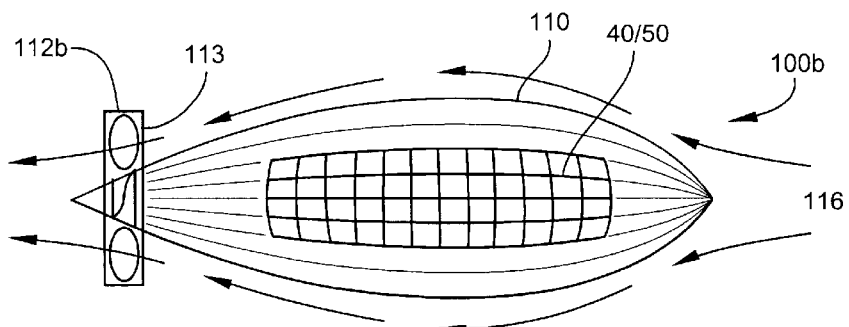
Fig. 3b
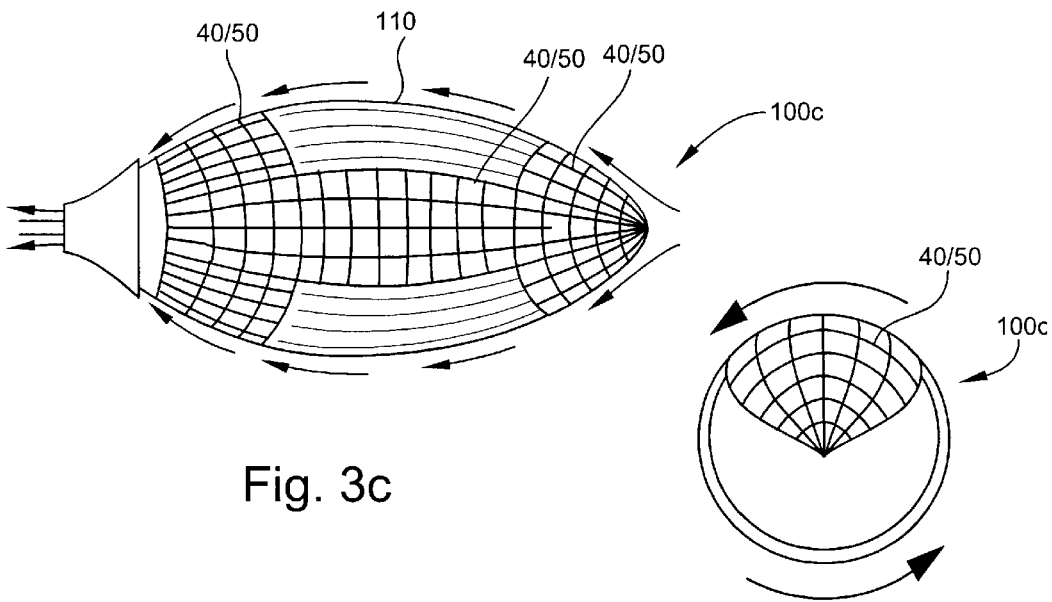
Fig. 3c
Fig. 3d

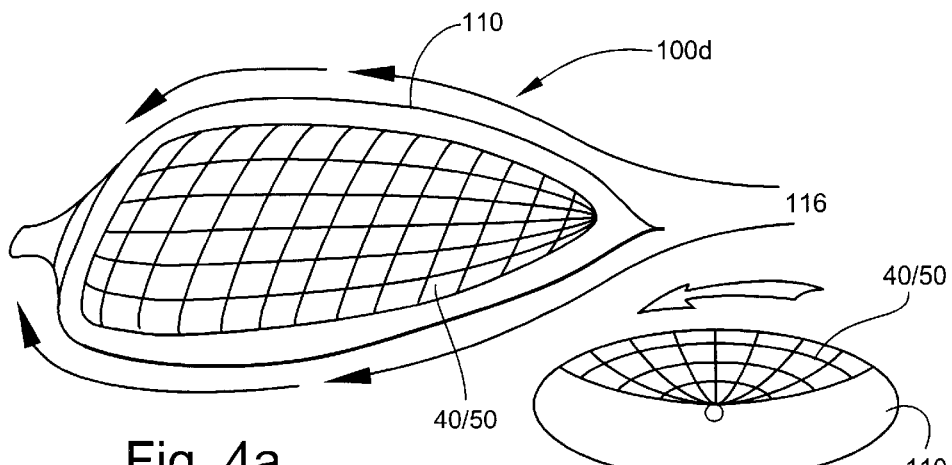
Fig. 4a
Fig. 4b
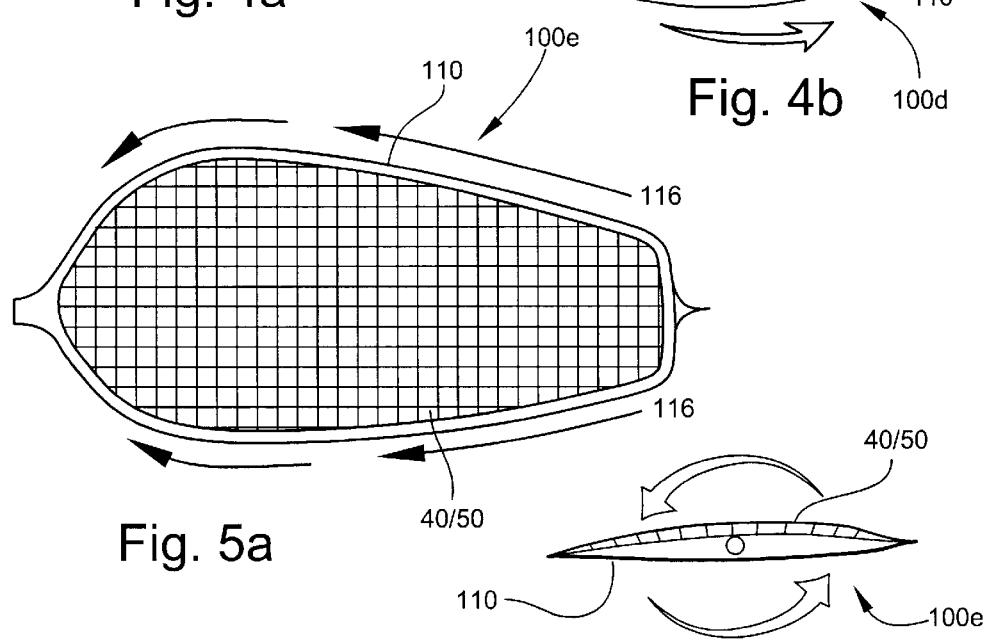
Fig. 5a
Fig. 5b
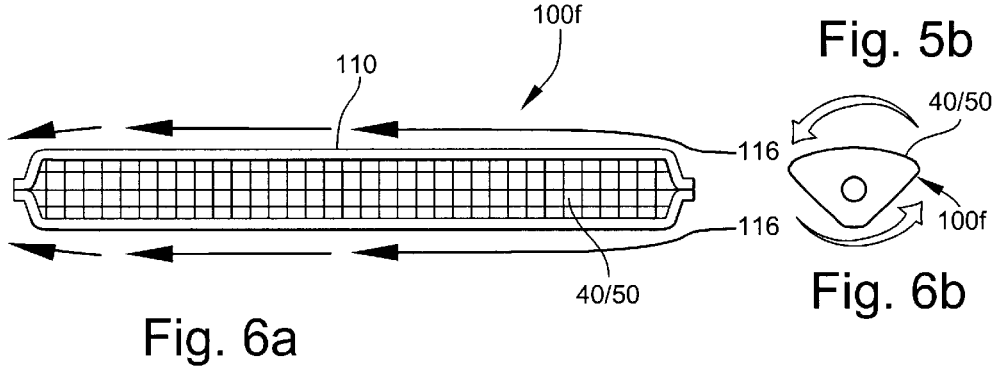
Fig. 6a
Fig. 6b

HYBRID WINGED AIRSHIP (DYNASTAT)

This application is related to Provisional U.S. Patent Application Serial No. 60/262,364, filed on Jan. 19, 2001.

BACKGROUND OF THE INVENTION

1. Field of the Invention

The present invention relates generally to aircraft, and more specifically to high altitude (stratoshperic), extended flight aircraft with variants capable of medium to low altitude flight for cargo transport or other tasks. More particularly, the invention comprises an unmanned hybrid winged airship (dynastat) designed for sustained flight utilizing electrically powered engines deriving electrical energy from on board solar collection cells and/or radio frequency (RF) energy collected by on board microwave antennas receiving RF signals from RF transmitters on the ground specifically located for this purpose.

2. Description of the Prior Art

Over time, airships have been developed in a variety of configurations ranging from the earliest hot air balloons to the great airships of the 1930s. The era of great transport airships was interrupted with the crash of the Hindenburg in 1937, and the development larger versions of the faster, fixed wing transport planes. More recently, relatively small blimps have been the predominant airship in use, being used primarily for promotional purposes and as short term platforms for camera equipment for sporting events.

Long term, high altitude (stratospheric) flight, either straight line or fixed position is desirable for a variety of reasons, including communications, weather monitoring and intelligence surveillance. Orbital satellites are expensive to put into place and, once in place, maintenance or modifications are difficult or impractical to carry out. Fixed winged (aerodyne) heavier-than-air (HTA) aircraft are more economical to operate and can be easily put into place, but altitude and flight duration limitations do not make them practical for long term communications, environmental sampling and monitoring, or imaging applications. Lighter-than-air (LTA) airships (aerostat), such as blimps and dirigibles, while able to maintain more prolonged flight durations, lack the stability to effectively maintain a fixed position relative to the earth's surface. A hybrid aerodyne/aerostat (dynastat) provides the best of both technologies, and a number of dynastat forms have been suggested in more recent years. None of these, however, has, singly or collectively, demonstrated the essential ingredients of the present invention, that is, multiple, low-drag, laminar-flow aerostats connected together with low-drag, high aspect ration airfoils (e.g., length over chord >10), in a tensegrity structure that allows aerostats containing patches of solar cells on their outer surface to rotate, thus maximizing exposure to the sun.

U.S. Pat. No. 5,581,205, issued to Stephen G. Wurst, et. al., on May 21, 1996, presents a HIGH ALTITUDE, LONG DURATION SURVEILLANCE SYSTEM comprising a pair of aerostats connected by rigid fore and aft wing assemblies. While a suspended gondola may be shifted to alter the center of gravity in a manner similar to the present invention, Wurst's wings are of a heavy design, providing the rigidity that is provided by a light weight tetrahedral stabilizer and cables system of the present invention, linking high aspect ration airfoils to laminar-flow aerostats in a manner that allows rotation of the aerostats about their longitudinal axis.

U.S. Pat. No. 5,425,515, issued to Tokuzo Hirose on Jun. 20, 1995, presents an AIRCRAFT and U.S. Pat. No. 5,383, 627, issued to Matsuro Bundo on Jan. 25, 1995, presents an OMNIDIRECTIONAL PROPELLING TYPE AIRSHIP, each having a plurality of aerostats joined by fore and aft wings. Both Hirose and Bundo utilize wings of a heavy, rigid construction to provide rigidity to the craft which is provided by the light weight tetrahedral system of the present invention, linking high aspect ration airfoils to laminar-flow aerostates in a manner that allows rotation of the aerostats about their longitudinal axis.

U.S. Pat. No. 5,240,206, issued to Sousuke Omiya on Aug. 31, 1993, presents an AIRSHIP, an aerostat having wing type control surfaces attached thereto. Omiya does not have the stability in flight of the present winged hybrid airship.

U.S. Pat. No. 3,856,238, issued to Frank S. Malvestuto, Jr., on Dec. 24, 1974, presents an AIRCRAFT TRANSPORTER comprising a plurality of aerostats joined by heavy wings segments placed at intervals along their length. Additional rigid fuselage members are spaced between the airships providing payload space. Again, all rigidity of the aircraft is provided by the wing/fuselage structure, as opposed to the light weight tetrahedral structure of the present invention, linking high aspect ratio airfoils to laminar-flow aerostats in a manner that allows rotation of the aerostats about their longitudinal axis.

U.S. Pat. No. 3,180,588, issued to J. R. Fitzpatrick on Apr. 27, 1965, presents a RIGID TYPE LIGHTER-THAN-AIR CRAFT wherein a plurality of aerostats are joined, side by side, by a rigid framework. Fitzpatrick is principally a large aerostat, presenting none of the control of a winged craft provided by the present winged hybrid.

None of the above inventions and patents, taken either singly or in combination, is seen to describe the instant invention as claimed.

SUMMARY OF THE INVENTION

The present invention presents a hybrid winged airship (dynastat) which is capable of sustained high altitude (stratospheric) flight, either straight line or over a fixed geographic position. The present invention is designed to be able to loiter at approximately 65,000 feet and remain stationary, relative to the earth's surface, in head winds of 65–70 knots. The combination of the low drag laminar-airflow aerostat and ultra lightweight high aspect ratio aerodyne technologies provides a platform for long term, electrically powered flight and the mounting of a diversity of monitoring devices thereon. Generation of electrical energy through solar collectors and/or Radio Frequency (RF) antennas and electrical storage in on board batteries and/or fuel cells allows electrical regeneration to sustain long term flight, while variants of the dynastat capable of medium to low altitude flight may be powered by conventional power sources, such as diesel.

Accordingly, it is a principal object of the invention to provide a dynastat which is lightweight, low drag and stable in flight.

Another object of the invention is to provide a dynastat which combines the advantages of lighter-than-air (LTA) (aerostat) and heavier-than-air (HTA)(aerodyne) aircraft.

It is another object of the invention to provide a dynastat which is modular in design and may be constructed in varying sizes and configurations.

It is a further object of the invention to provide a dynastat which is structurally stable through principles of tensegrity, and at least partially maneuverable through active manipulation of the center of gravity.

Yet another object of the invention is to provide a dynastat which is capable of high altitude flight, with variants capable of medium to low altitude flight for cargo transport or other tasks.

It is a further object of the invention to provide a dynastat which is capable of long term flight.

Still another object of the invention is to provide a dynastat which has a renewable power source (conversion to electrical energy of solar and/or RF waves).

Another object of the invention is to provide a dynastat which is capable of autonomous flight and payload control through on board sensors, including global positioning via satellites (e.g. GPS).

An additional object of the invention is to provide a dynastat which is maneuverable by remote control through earth based transmissions.

It is again an object of the invention to provide a dynastat which is of lightweight construction.

Yet another object of the invention is to provide a dynastat which is capable of carrying and powering an array of devices thereon which may be monitored from a ground station.

Still another object of the invention is to provide a dynastat wherein solar collectors may be either fixed position or adapted to track the sun for maximum harvesting of solar energy, or both.

Another object of the invention is to provide a dynastat capable of receiving RF energy from an earth station to supplement or replace solar energy, as needed.

It is another object of the invention to provide a dynastat having microwave antennas which are either fixed position or adapted to track RF transmitters on the earth's surface, or both.

It is again an object of the invention to provide a dynastat with efficient means for descent back to earth, including safe return to earth from stratospheric altitudes without heavy or costly mechanism for facilitating that process in the event of failure of the aerostat (loss of helium) at operational altitude.

Still another object of the invention is to provide a dynastat, solar or non-solar powered, which, at low altitudes, derives primary lift from the aerostats and maneuverability from the airfoils, thereby allowing uses as a lift vehicle.

It is again an object of the invention to provide a dynastat capable of tracking its location relative to the surface of the earth and making corrections in course to maintain a designated position.

It is an object of the invention to provide improved elements and arrangements thereof in an apparatus for the purposes described which is inexpensive, dependable and fully effective in accomplishing its intended purposes.

These and other objects of the present invention will become readily apparent upon further review of the following specification and drawings.

BRIEF DESCRIPTION OF THE DRAWINGS

Various other objects, features, and attendant advantages of the present invention will become more fully appreciated as the same becomes better understood when considered in conjunction with the accompanying drawings, in which like reference characters designate the same or similar parts throughout the several views, and wherein:

FIG. 2a is a perspective view of an airfoil segment using the first embodiment of the central beam structure of FIG. 1a.

FIG. 3a is a side view of the Goldschmied laminar flow aerostat with midsection gas containment system, solar cell panels on the airship skin surface, and aft propulsion.

FIG. 3b is a side view of an alternate laminar-flow aerostat having a different mode of boundary layer control using a low drag streamlined shape and an external, ducted fan.

FIG. 3c is a side view of an aerostat having additional solar cells fore and aft.

FIG. 3d is a front view of the alternate laminar-flow aerostat of FIG. 3c.

FIG. 4a is a perspective view of an alternate, oblate, aerostat configuration.

FIG. 4b is a front view of the alternate aerostat configuration of FIG. 4a.

FIG. 5a is a side view of an alternate, flat aerostat configuration.

FIG. 5b is a front view of the alternate aerostat configuration of FIG. 5a.

FIG. 6a is a side view of an alternate, non-aerostat fuselage structure.

FIG. 6b is a front view of the alternate, non-aerostat fuselage structure of FIG. 6a.

FIG. 7b is a side view of the aerostat structure and solar collection system of FIG. 7a.

FIG. 12b is a perspective view of a non-aerostat version of FIG. 12a.

DETAILED DESCRIPTION OF THE PREFERRED EMBODIMENTS

In the interest of simplicity, initial discussion will be of individual elements of the invention which will later be combined to form a whole.

Figure 1A:
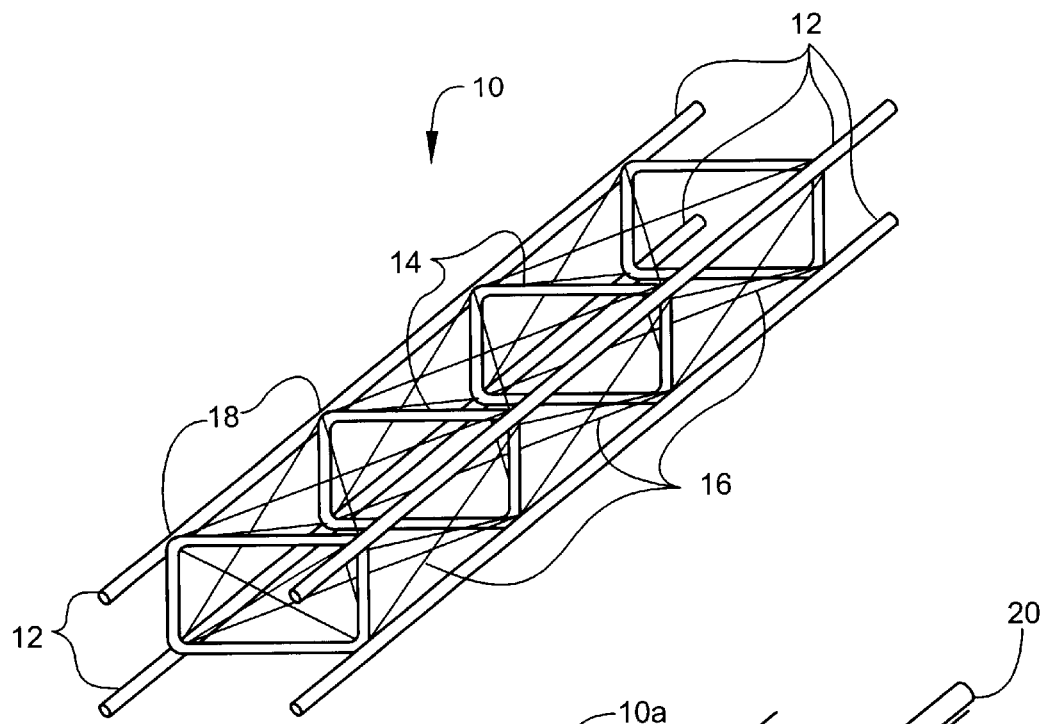
FIG. 1a is a perspective view of a first embodiment of the central beam structure used in construction of the airfoils, struts, booms and airships.

FIG. 1a presents a first embodiment of the central beam structure 10 for the ultra-light airfoils, struts and airship framework. A plurality of rigid, lightweight longitudinal rods or hollow tubes 12 are arranged parallel to one another, preferably in a rectangular configuration. Hereinafter, the term rod will be used to represent either a solid rod or hollow tube. Longitudinal rods 12 are connected at regular intervals by rigid cross rods 14, normal to the longitudinal rods 12. Beam cables 16 of steel or other high strength fiber, as are known in the art, connecting each diagonally opposite pair of junctures 18 of longitudinal rods 12 and adjacent pairs of cross rods 14 provide structural stability against axial compressive forces, vertical bending moments due to aerodynamic lift, and lateral bending or torsion moments due to stresses of flight.

Figure 1B:
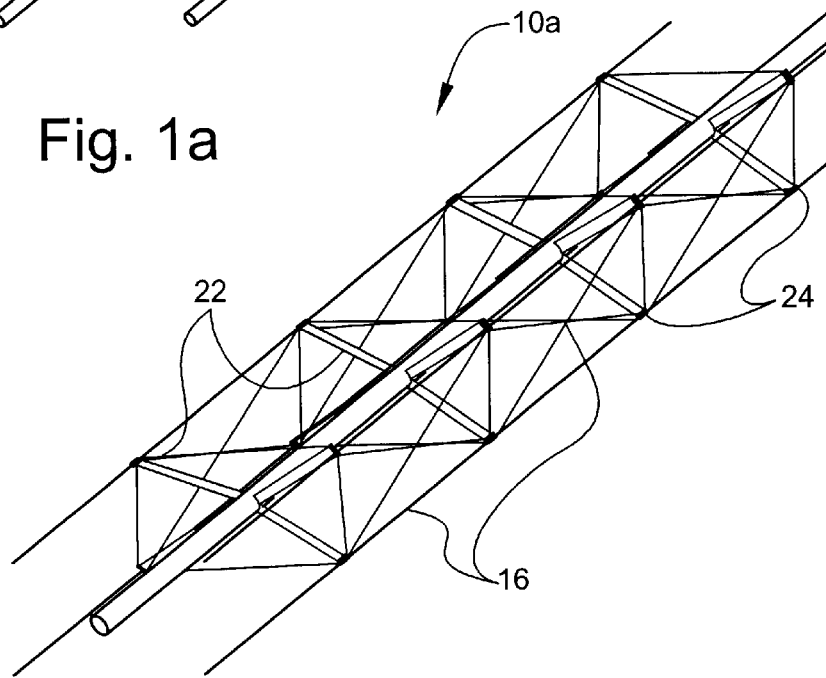
FIG. 1b is a perspective view of a second embodiment of the central beam structure used in construction of the airfoils, struts, booms and airships.
Figure 1C:
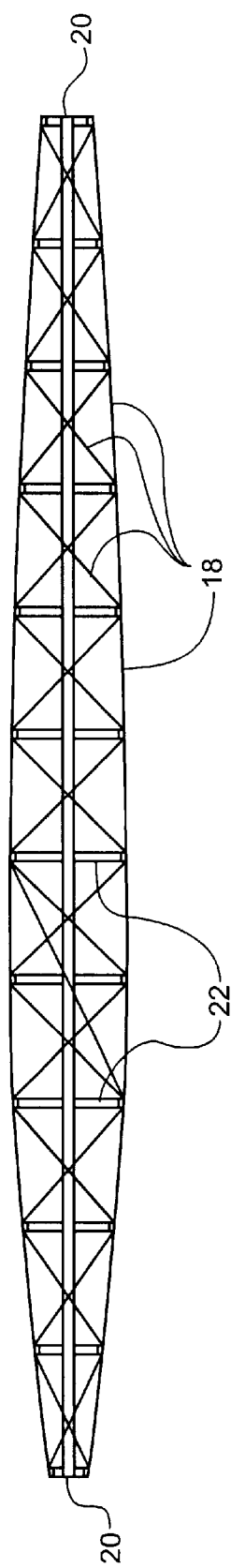
FIG. 1c is a front view of a variant of the second embodiment of FIG. 1b.

FIG. 1b presents an alternative central beam structure 10a consisting of a single rigid, lightweight central rod 20. A plurality of rigid stays or stand off members 22 are affixed to central rod 20 at regular intervals, such that each set of stand off members 22 is normal to central rod 20 and substantially parallel with one another. Cables 16 again provide structural stability, connecting the free ends 24 of each stand off member 22 within a set of stand off members 22, the free ends 24 of corresponding stand off members 22 in succeeding sets of stand off members 22, and diagonally opposite free ends 24 of stand off members 22 in succeeding sets of stand off members 22, thereby forming a substantially rectilinear framework. As illustrated in FIG. 1c, stand off members 22 could optionally be longer at the central portion of central rod 20 than those at the ends of central rod 20, thus increasing the resistence against bending of central rod 20.

The longitudinal rods 12, cross rods 14, central rods 20 and stand off members 22 illustrated in FIGS. 1a, 1b and 1c are of a material such as, but not limited to, a graphite fiber or Kevlar® in a polymeric matrix, as are known in the art, while cables 16 are of steel or other high tensile strength fibers as are known in the art.

Figure 2A:
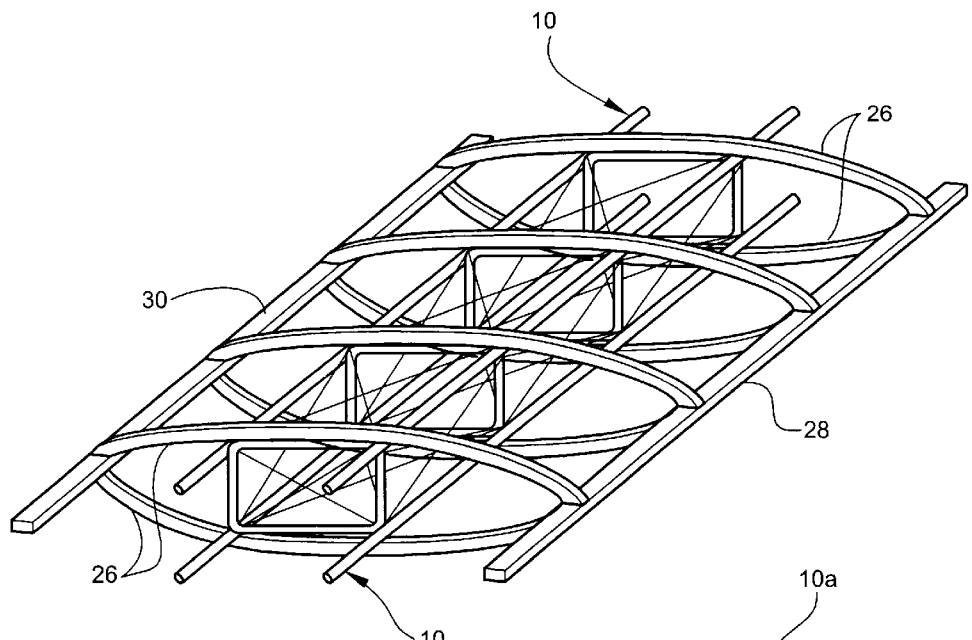
Figure 2B:
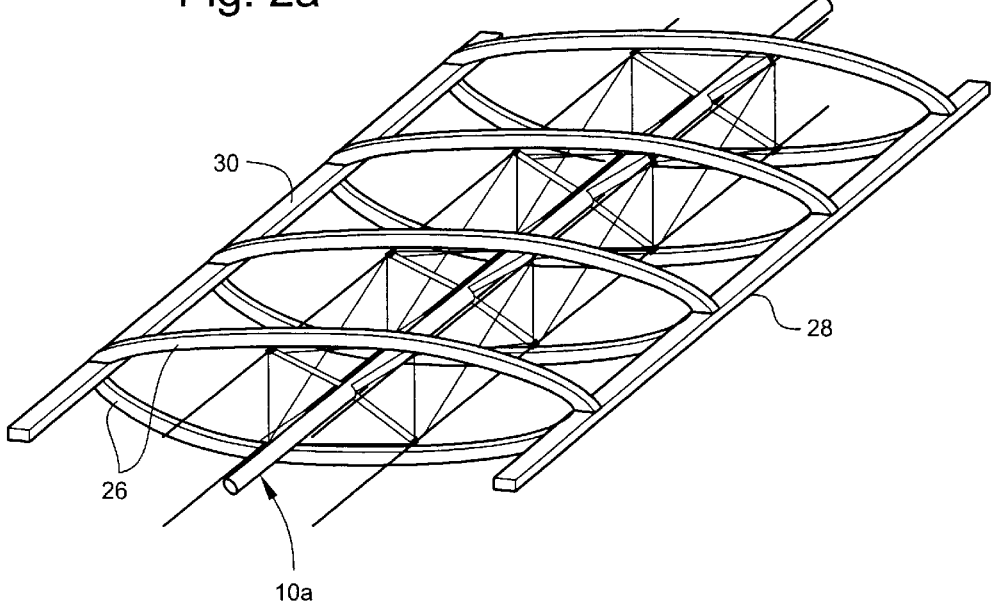
FIG. 2b is a perspective view of an airfoil segment using the second embodiment of the central beam structure of FIG. 1b.

FIGS. 2a and 2b illustrate the airfoil substructure constructed around the central beam structure 10 and 10a of FIGS. 1a and 1b, respectively, with airfoil ribs 26, leading airfoil frame 28 and trailing airfoil frame 30 attached thereto. Airfoil ribs 26, leading airfoil frame 28 and trailing airfoil frame 30 are of a lightweight foam or other composite material, as are well known in the art, having sufficient rigidity for attachment of an outer membrane (not shown) such as TEDLAR® or other polymeric material as are known to the art. Airfoils ribs 26 are shaped to create an aerodynamic shape as are well known in the aviation art.

As stated heretofore, a variety of aerostat designs have been developed over the years and are well known to the airship art. Any number of these aerostat designs could be modified for use in the present invention, and the specifics of the aerostat construction will not be discussed herein. Several alternative aerostat embodiments will be discussed, however, without limiting the aerostats to these designs.

A smooth laminar air flow (flow of air around the surface of the aerostat and away from the aft end of the aerostat) is of major importance in order to minimize turbulence of flow or wake drag which might impair smooth flight of the dynastat 1. Several existing, preferred airflow devices, as are well known in the aerostat art, will be presented hereinbelow, without detailing the exact construction thereof or limiting design to these specific devices, as others are well known in the art.

FIG. 3a depicts the Goldschmeid laminar flow aerostat 100a, without the typical tail boom and tail assembly, but rather having an aft suction slot (to be discussed later). As is typical of LTA craft, the aerostat 100a is comprised primarily of a gas containment bag 110, formed of TEDLAR® or other polymeric material, as are known to the art, defining the overall shape of the craft. Mounted at the rear of gas containment bag 110 is an aft section housing 112a containing an electric motor (not shown) with a propeller or fan (not shown) for propulsion. An aft suction slot 114 formed between gas containment bag 110 and aft section housing 112a provides boundary layer air flow control. Arrows 116 illustrate air flow around the airship 100a, through the suction slot 114 and out the exit nozzle 118. An array of solar collection cells 40 may be disposed on the outer surface of aerostat 100a in any of a variety of configurations to optimize the collection of solar energy. The solar collection cells 40 are composed of thin, interconnected solar cells made from silicon, gallium arsenide or other material as are known in the solar energy collection art, and sandwiched between sheets of TEDLAR® or other polymeric material as are known to the art. Surface mounted microwave antennas 50 may be mounted in lieu of or in addition to solar collection cells 40, the microwave antennas 50 for receiving RF energy from ground transmitters for supplimenting/replacing solar collected energy.

FIG. 3b is a side view of an alternative laminar airflow aerostat 100b, similar in design to that of FIG. 3a, having a gas containment bag 110 of TEDLAR® or other polymeric material, as are known to the art, defining its overall shape. In lieu of aft section housing 112a, however, a more open aft housing 112b, having one or more ducted fans/propellers 113 enhances laminar air flow over the gas containment bag 110.

FIGS. 3c and 3d illustrate optional arrangements of solar collector cells 40 and/or microwave antennas 50 at the fore and aft ends of aerostat 100c to optimize collection when the sun is in a nose on/tail on attitude.

FIGS. 4a and 4b illustrate an additional laminar flow aerostat 100d design in which the gas containment bag 110 has a flattened, oblate configuration which provides added surface for exposure of solar collection cells 40 and/or microwave antennas 50 normal to the sun/transmitter, but at the expense of gas containment volume. Due to the reduced gas containment volume, this embodiment must rely more on the airfoils (to be discussed later) for lift than the previously discussed aerostat designs.

FIGS. 5a and 5b, 6a and 6b present non-airship fuselage structures 100e and 100f, respectively, which rely solely on the airfoils (to be discussed later) for lift, but provide surface area for solar collection cells 40 and/or microwave antennas 50.

In each embodiment presented in FIGS. 3, 4, 5, and 6, the aerostat 100a, b, c, d or e or non-airship fuselage 100f may be rotated about its longitudinal axis, as indicated by arrows of FIGS. 3c, 4b, 5b, and 6b, to present the solar collections cells 40 and/or microwave antennas 50 to the sun/transmitter at the most direct angle for reception.

Figure 7A:
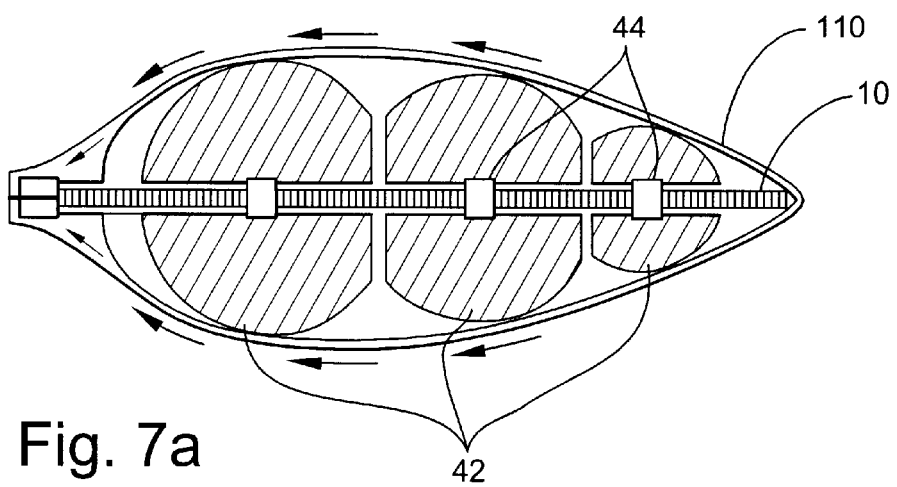
FIG. 7a is a top view of an aerostat structure having an internal, flat-panel, tracking, solar collection system.
Figure 7B:
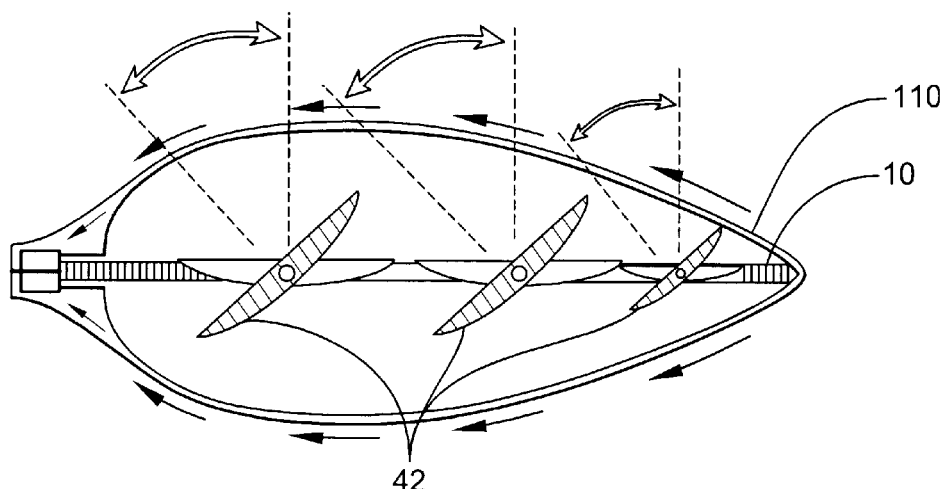
Figure 7C:
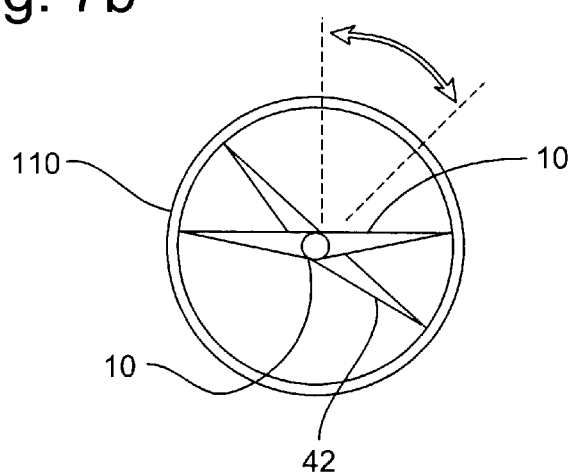
FIG. 7c is a front view of the aerostat structure and solar collection system of FIGS. 7a and 7b.

Referring now to FIGS. 7a, 7b, and 7c, an alternative to or addition to surface mounted solar collection cells 40 and/or microwave antennas 50 is presented. Gas containment bag 110 is formed of a transparent or highly translucent TEDLAR® or other polymeric film, as are known in the art, which would allow the solar rays or microwave/RF waves to pass therethrough. A rotatable central beam 10 runs along the longitudinal axis of aerostat 100. A plurality of arrays 42 of solar collection cells 40 and/or microwave antennas 50 are mounted along the length of central beam 10 by array hinges 44. Each array 42 of solar cells 40 and/or microwave antennas 50 is rotatable at array hinge 44 about an axis normal to central beam 10. By the compounded rotation of central beam 10 and arrays 42, solar cells 40 and/or microwave antennas 50 may be aligned in virtually any direction for line of sight tracking of either the sun or ground transmitters.

Figure 8:
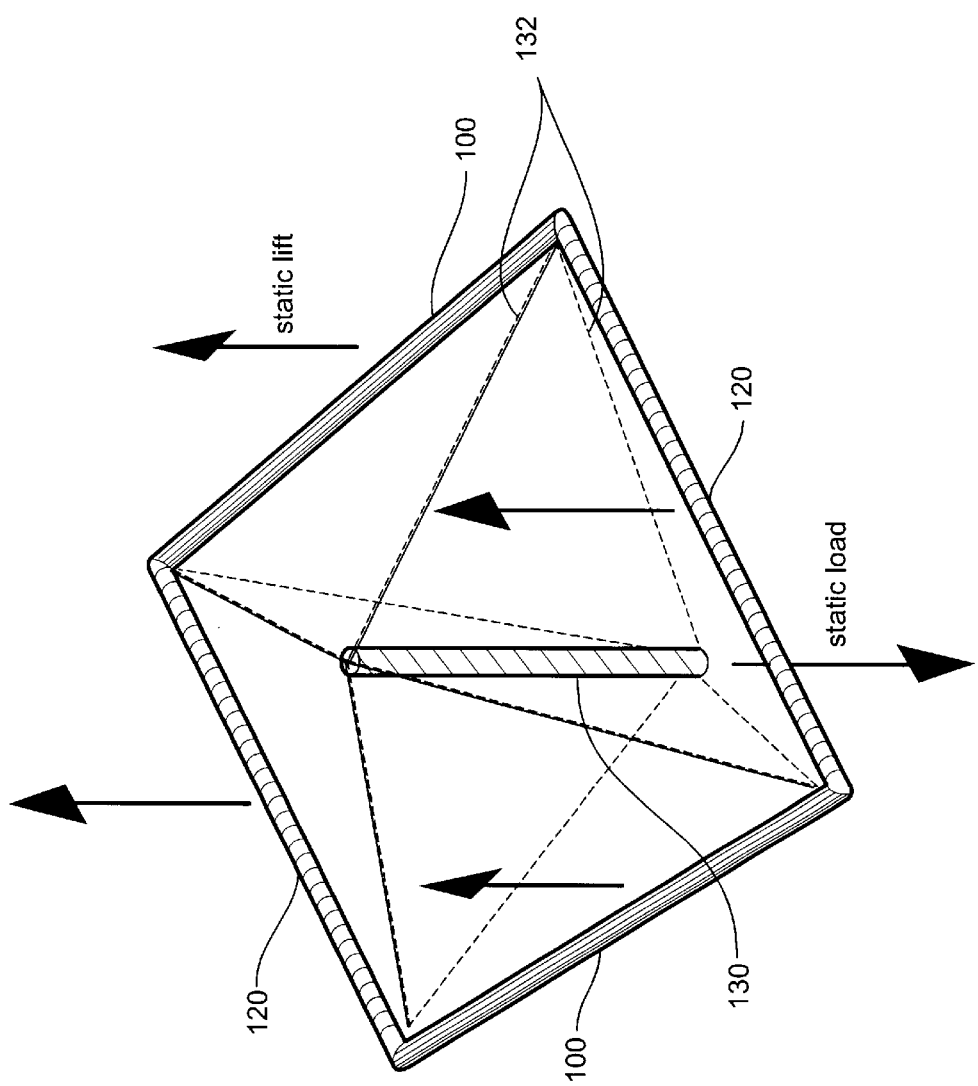
FIG. 8 is a vector diagram illustrating the forces exerted on the dynastat.

FIG. 8 presents a vector diagram illustrating the forces exerted on dual aerostat 100 embodiment of dynastat 1. This same vector diagram applies to each dual aerostat 100 segments of any embodiment having more than the basic two aerostat 100 components. Airfoils 120 connect aerostats 100 at their fore and aft ends. Typically the aerostats 100 are attached to airfoils 120 at the ends of their central beams 10 (FIGS. 7a, 7b), although airfoils 120 could penetrate the gas containment bag 110 of aerostat 100 to be attached to the central beam 10 of aerostat 100 along its length. A vertical stabilizer 130 rises at the center of the aperture formed by the pairs of aerostats 100 and airfoils 120. Vertical stabilizer 130 is attached to aerostats 100 and airfoils 120 at each of their junctures by cables 132 running from each of the two ends of vertical stabilizer 130. A payload pod 140 may be suspended, either by direct attachment or by suspension, from the lower end of vertical stabilizer 130, or be contained within vertical stabilizer 130. As illustrated by FIG. 8, aerostats 100, airfoils 120 and vertical stabilizer 140 act as compressive members while cables 132 act as tension members, forming a tetrahedral shaped structure capable, as a unified platform, to withstand sheer forces and other stresses encountered in flight. This tetrahedral structure comprises the CG Trim package, as will be referred to later. Aerostats 100 exert static lift on dynastat 1, while airfoils 120 exert dynamic lift and payload pod 140 exerts a static load. The dynastat 1 is designed to fly like an aerodyne, or fixed wing aircraft, while utilizing the buoyance of the aerostats 100 to aid in the ascent to altitude and enhance the payload carrying capacity at altitude.

FIG. 8 further illustrates an added feature of the dynastat 1, especially at stratospheric altitudes, which is important from a safety and/or a systems-engineering point of view. In ordinary aerostat operation, during ascent the ballonet empties as the volume of helium expands to compensate for lower pressure on the exterior of gas containment bag 10 (the exterior and internal pressures must be at or near equilibrium). Alternatively, in the absence of a ballonet, the helium must be vented from the gas containment bag 10 or compressed into a tank/liquified to cryogenic temperatures as the aerostat rises. At stratospheric altitudes, the lifting power of helium in its gaseous form is minimal.

The high altitude embodiment of dynastat 1 has a significant design advantage over conventional aerostats in ability to descend safely and economically to earth after the mission, for replenishment and recycling. For conventional aerostats, the helium or other LTA gas is the only means of lift (1/20th lift at stratoshperic altitudes versus sea level). For a conventional aerostat to descend and maintain an approximate equilibrium between interior gas pressure and the external atmosphere, helium or hydrogen gases must be introduced from on-board sources (stored compressed gas, cryogenic liquid), or the aerostat's gas bag must be super heated to maintain pressure equilibrium, with an internal gas that is still lighter than air. Otherwise, the constantly increasing weight of the descending aerostat, without a compensating increase in lift, would ultimately lead to a catastrophic, uncontrollable plunge to earth.

The hybrid dynastat 1 requires no such equipment (compressors, cryogenic storage, re-heaters), since the loss in lift of the aerostats 100 during descent can be more than compensated for by the increasing dynamic lift of the airfoils 120, by a controlled increase in velocity translating potential energy into kinetic energy. The dynastat 1 literally flies to the ground in a controlled descent. Even if there were a catastrophic failure of the gas containment bag 110 of one of the aerostats 100, and a total venting of the helium therein, there would still remain a fail-safe way to return to earth with an adjustment of the CG Trim mechanism and reliance on the airfoils 120 for a controlled descent.

Now that the various elements of the dynastat 1 have been described, attention will be turned to the specific composition of various embodiments of the dynastat 1.

Figure 9:
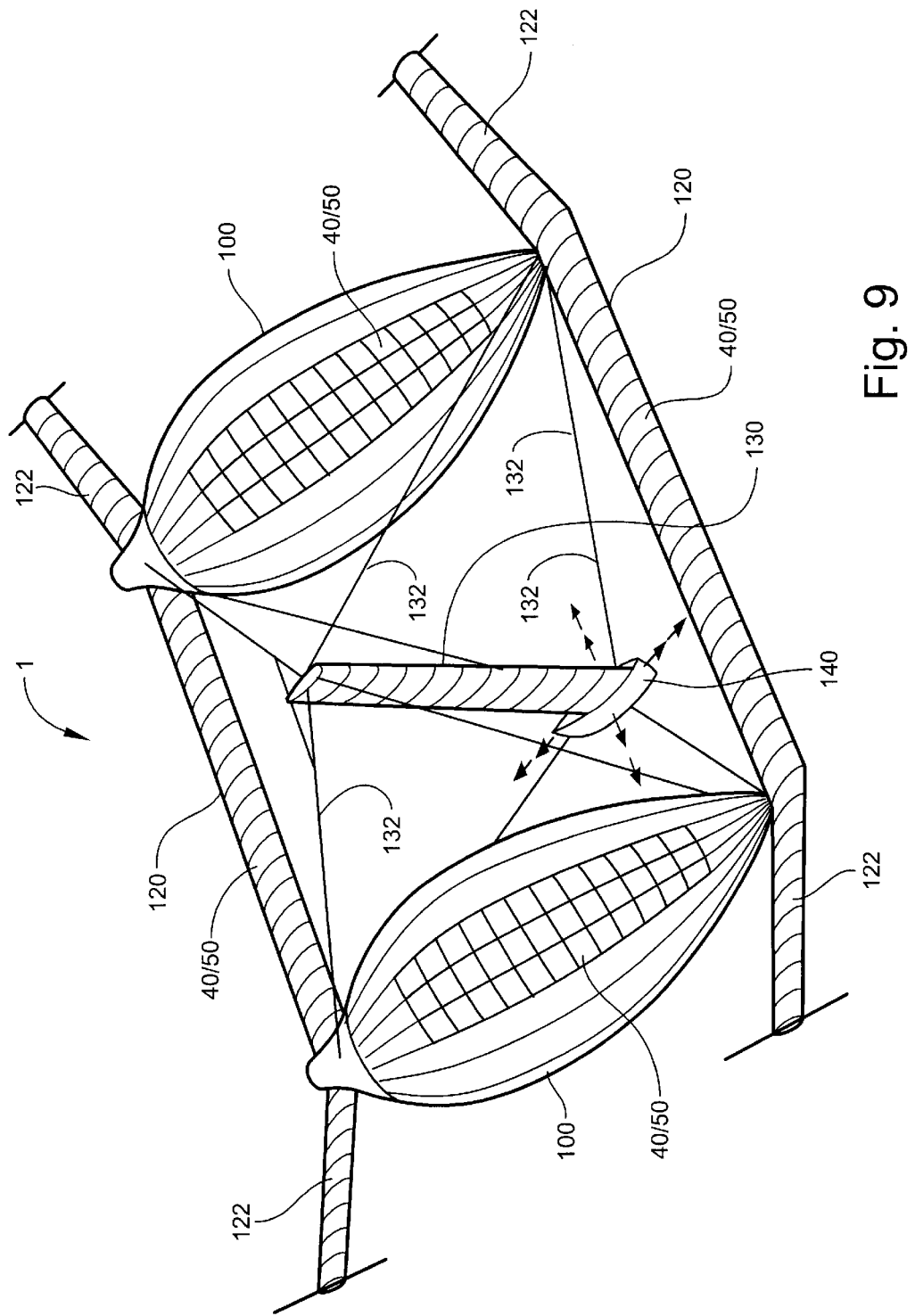
FIG. 9 is a perspective view of a twin aerostat/mono-airfoil version of the dynastat.

FIG. 9 is a perspective view of the twin-aerostat 100, monoairfoil 120 version of the dynastat 1. As pointed out hereinabove, a pair of aerostats 100 are attached, fore and aft by airfoils 120 and a vertical stabilizer 130 and payload pod 140 are suspended by cables 132 within the aperture formed between aerostats 100 and airfoils 120. Outer airfoil segments 122 extend outboard of aerostats 100 at the ends of airfoils 120. The top surface of airfoils 120 may be covered with solar collection cells 40 and/or microwave antennas 50 similar to those mounted on the aerostats 100 (FIGS. 3 thru 4).

The cables 132 of the lower part of the structure can be adjusted through mechanisms in the payload pod 140 at the bottom of vertical stabilizer 130 to adjust the length of each cable 132 such that the payload pod 140, as well as vertical stabilizer 130, pivots about a pivot point relative to aerostats 100 and airfoils 120. The center of gravity of the payload can thereby be moved in any direction about the base of vertical stabilizer 130.

The payload pod 140 contains the heaviest components of the platform, such as an avionics computer (not shown), energy storage system (batteries and/or fuel cells) (not shown), communications electronics (not shown) and other hardware (not shown). The repositioning of the payload by the CG Trim system changes the center of gravity of the entire platform relative to the center of lift of the aerostats 100 and airfoils 120, thus effecting gradual turns and altitude adjustments.

Figure 10:
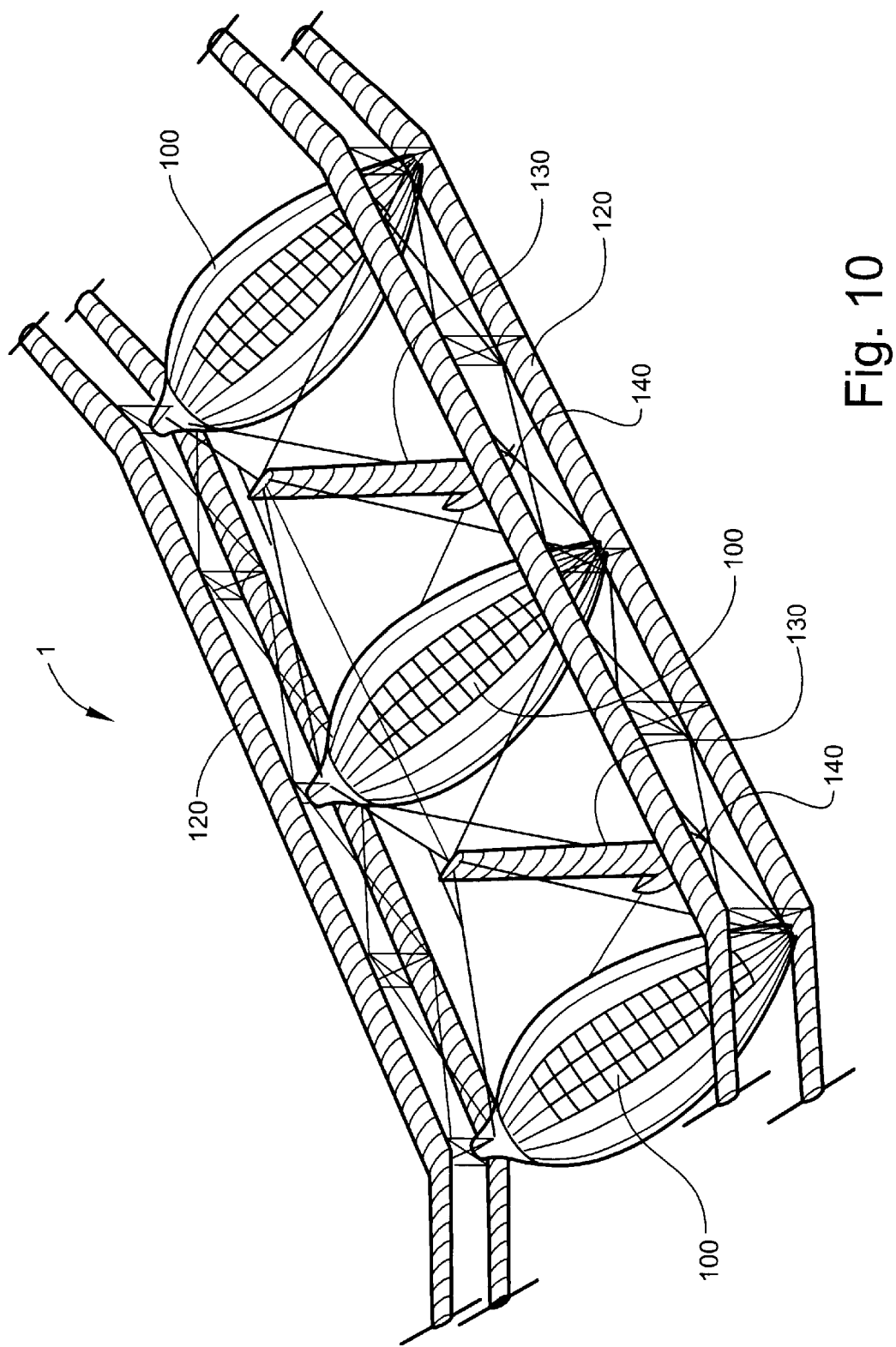
FIG. 10 is a perspective view of an expanded, triple aerostat/bi-airfoil embodiment of the dynastat.

Referring now to FIG. 10, a triple aerostat 100, bi-airfoil 120 embodiment of the dynastat 1 is depicted, illustrating that modular construction may be utilized to expand the dynastat 1 for larger payloads. Additional aerostats 100 provide added static lift to the dynastat 1 while additional airfoil 120 segments and the addition of bi-wing airfoils 120 increase dynamic lift pressures. The added vertical stabilizers 130 and payload pods 140 increase payload capacity.

Figure 11:
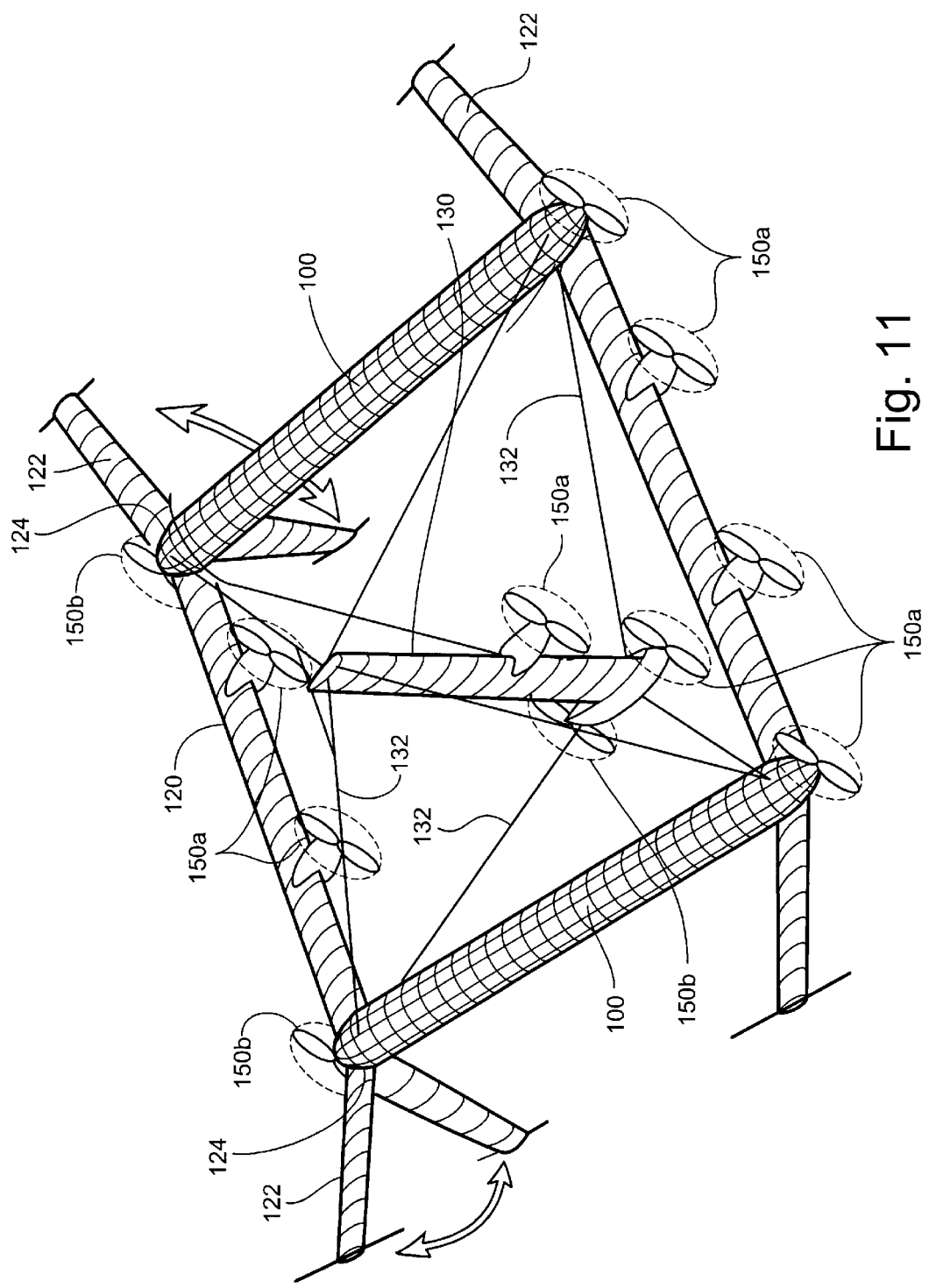
FIG. 11 is a non-aerostat embodiment of the dynastat.

In FIG. 11, a non-airship fuselage 100 embodiment of the dynastat 1, having a twin, rigid fuselage 100, is presented. Although lacking the static lift of the aerostats 100 of other embodiments, the non-airship fuselage 100 is constructed of the lightweight components set forth hereinbefore, creating an extremely lightweight fuselage 100. Also set forth in FIG. 11 is the application of an airfoil hinge 124 at the juncture of outboard airfoil segments 122, airfoils 120 and aerostats 100. Airfoil hinge 124 allows the outboard airfoil segments 124 to be folded downward by gearing to form landing gear. Lightweight wheels and/or skids (not shown) on the tips of outboard airfoil segments 124 allow for rolling or skidding of dynastat 1 during takeoff and landings. All four outboard airfoil segments 124 could drop for landings, or only those on the fore or aft airfoil 120, using the lower end of vertical stabilizer 130 or payload pod 140 as a third point for a three point landing, as illustrated. Placements for electric engines 150 are also illustrated, with either pusher engines 150a or puller engines 150b being applicable in varying locations, such as leading airfoil 120 edges, trailing airfoil 120 edges, vertical stabilizer 130 edges, or payload pod 140.

Figure 12A:
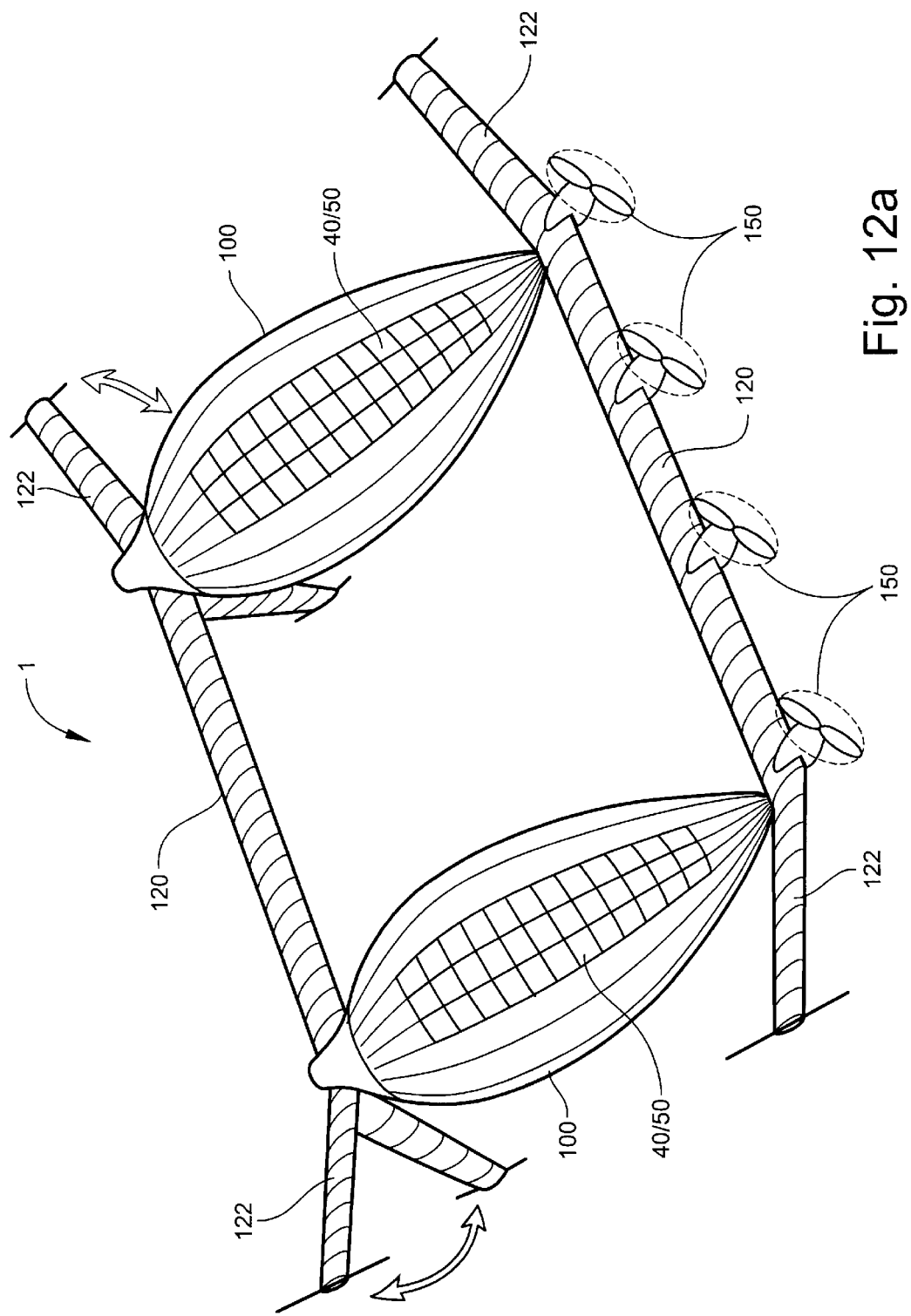
FIG. 12a is a perspective view of a twin aerostat/monoairfoil version of the dynastat, lacking the vertical stabilizer and tensioning cables.
Figure 12B:
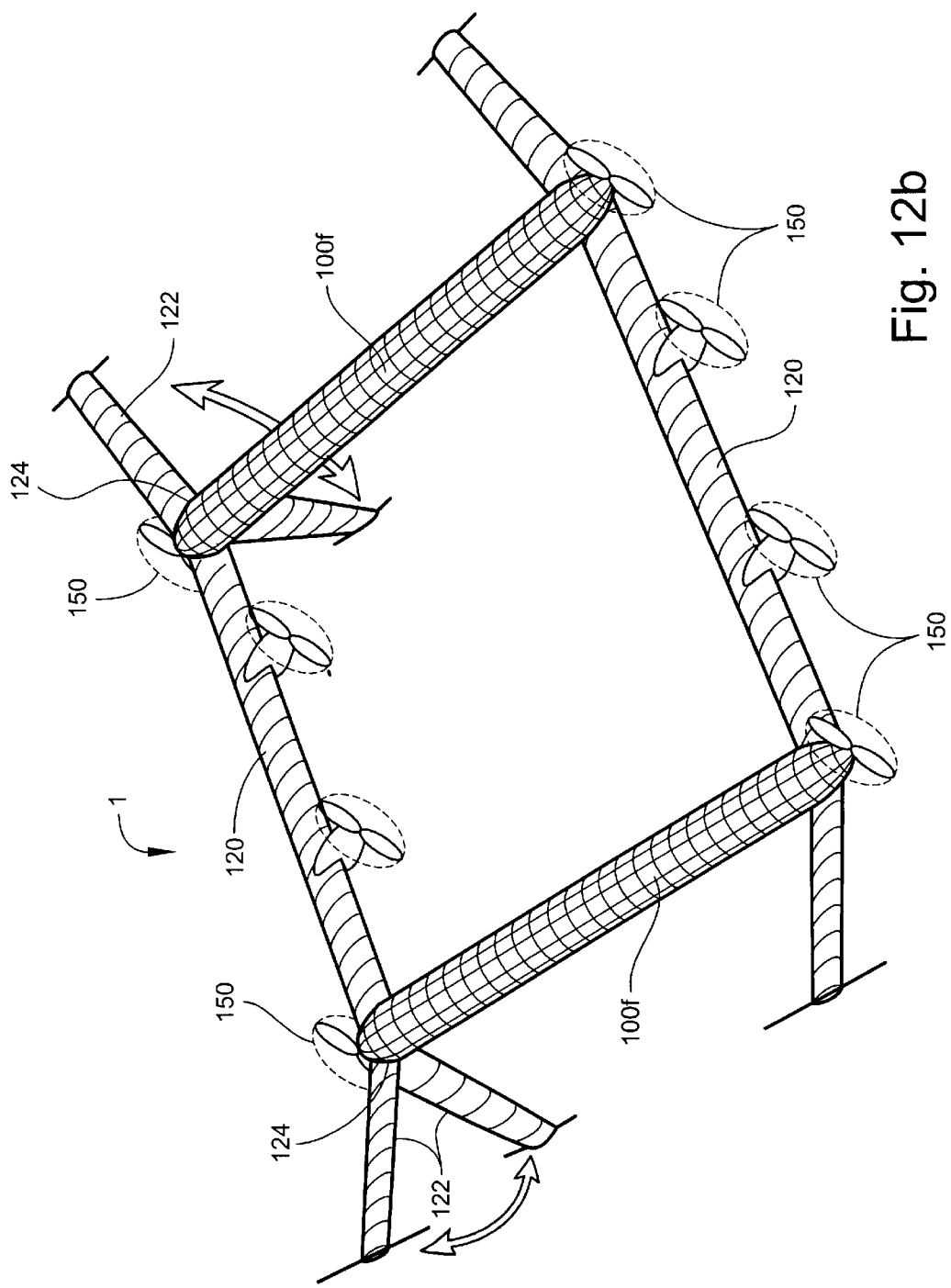

FIGS. 12a and 12b depict aerostat 100 and non-aerostat fuselage 100 embodiments of dynastat 1 without the tensegrity structure of the vertical stabilizer 130 and cables 132. Lacking the tensegrity structure, the aerostats 100 or non-aerostat fuselages 100 must be rigidly attached to the airfoils 120 through the central beam 10 structure, as has previously been suggested. These joints must be sufficiently strong to withstand torque and other stresses of flight. Since these versions do not have the CG Trim referred to previously, additional outer airfoil segments 122 are added in the aft of the dynastat 1, to provide yaw stability as well as a means for achieving roll, pitch and yaw movements of the dynastat 1. This is achieved by rotating outer airfoil segments 124 around their vertical axis to achieve yaw control. Turns are also accomplished, in all embodiments, by differential adjustment of engine 150 speeds, creating additional thrust in the engines outboard of the turn. Lightweight wheels or skids (not shown) provide for takeoff/landing, as previously disclosed. Payload, including batteries or fuel cells (not shown), communications equipment (not shown), etc., is distributed throughout the platform, internal to aerostats 100 and airfoils 120. Liquid payloads may be stored within hollow longitudinal rods 12, cross rods 14, or stand off members 12, as well as pods added to the structure for that purpose.

Figure 13:
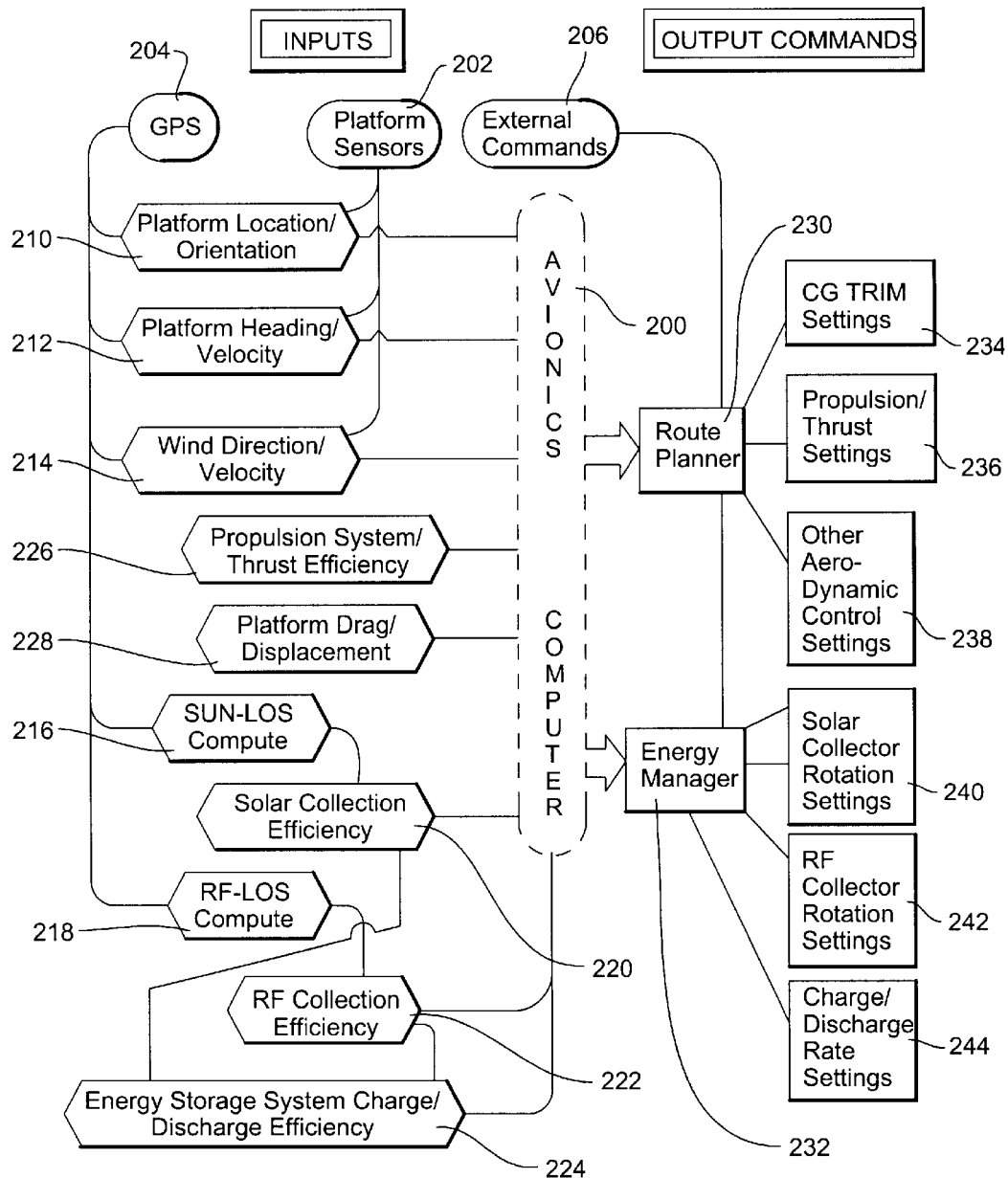
FIG. 13 is a schematic of the control strategies for the dynastat.

In FIG. 13 the control strategies for control of the dynastat 1 using the on board avionics computers 200, on board platform sensors 202, external Global Positioning System (GPS) 204 input,; and ground control command input 206 are described. These strategies support the autonomous navigation and station keeping functions; energy production, storage and utilization; and in transit flight functions. The parameters for these strategies include:

Platform Location and Orientation 210: Longitude, latitude and altitude of the platform, as well as roll, pitch and yaw of the platform as determined by on board platform sensors 202 and GPS 204;

Platform Heading and Velocity 212: Heading (direction of flight relative to North) as determined by on board sensors 202 as well as computed change of position over time by GPS 204;

Estimated wind direction and velocity 214: Computed by avionics computer 200 utilizing input from on board sensors 202 (apparent wind speed and direction) as adjusted by Platform Heading and Velocity 212. These estimates can be supplemented by estimates of platform speed in ambient air, at altitude, based on model of thrust and drag as a function of electrical energy expended on the electric engines 150;

Solar Line-of-Sight (SUN-LOS) Computation 216: Computation by avionics computer 200 of the direction of the sun relative to the position and orientation of the platform given latitude, longitude, date, and time of day, with a look up table or algorithm in avionics computer 200;

Radio Frequency (RF) Line-of-Sight (RF-LOS) Computation 218: Computation by avionics computer 200 of the direction of ground based RF transmitters relative to the position and orientation of the platform;

Solar Collection Efficiency 220: Computation of appropriate angle of rotation of aerostats 100 having surface mounted solar collection cells 40 or other rotatable solar collection cells 40, in order to maximize the amount of solar energy collected, given the current SUN-LOS 216;

RF Transmission/Collection System Efficiency 222: Computation by avionics computer 200 of the appropriate angel of rotation of aerostats 100 having surface mounted microwave antennas 50 or other rotatable microwave antennas 50, in order to maximize the amount of RF energy collected, given the current RFLOS 218;

Energy Storage System Charge/Discharge Efficiency 224: Computations by avionics computer 200 assessing the appropriate charge and discharge rates of the energy storage system 152 to assure charge/discharge efficiency and prolong battery life.

Propulsion System/Thrust Efficiency 226: Computations by the avionics computer 200 which assess the appropriate RPM settings of the electric engines 150 to assure adequate thrust to maintain altitude and make course corrections to perform the mission with minimal expenditure of energy from the solar or RF collection systems and/or battery stored energy. Thrust efficiency may vary from engine to engine depending on location on the platform and maneuver being performed.

Platform Drag/Displacement 228: All structures of the dynastat 1 contribute to the platform drag in the direction of motion, as well as to the displacement of the dynastat 1 by cross winds. This drag and displacement is highly dependent on the aspect angle between the platform heading and the wind direction and increases in severity with increased platform velocity and wind intensity. A computation is made by the avionics computer 200 assessing the appropriate angle of rotation of the solar collection panels 50 in order to maximize the amount of solar energy collected while minimizing the adverse effects of drag and displacement cross section of the platform.

Route Planner 230: As has previously been stated, the hybrid platform can be used for a number of different missions, including telecommunications, high altitude environmental sampling, platform to platform information/data relay, and remote imaging/surveillance and sensing. The route planner, using input from GPS 204 and look up tables, logic trees or other algorithms, optimizes the best route or orbit (for stationary positioning) based on wind, available energy, and time allowed for point to point transitions by automatically adjusting CG-Trim settings 234, engine Propulsion/Thrust Settings 236 and Other Aerodynamic Control Settings 238. These adjustment may also be effected through External commands 206 from earth based transmissions.

Energy Manager 232: A program within the avionics computer 200 which monitors Energy Storage System Charge/Discharge Efficiency 224, Solar Collection Efficiency 220, RF Collection Efficiency 222 and projected future energy requirements based on inputs from the Route Planner 230. The program directs the Solar Collector Rotation Settings 240, RF Collector Rotation Settings 242, and Charge/Discharge Rate Settings 244 to make necessary adjustments for maximal alignment for energy acquisition, optimal storage and minimal expenditures to the electric engines 150 to achieve the necessary platform velocity required by the Route Planner 230 with look up tables or other algorithms in the avionics computer 200 providing data on total time of isolation and angle of sun for any particular day or location (longitude, latitude, date, and time of day).

In an alternate, low altitude, heavy payload version of the dynastat 1 having strengthened structural members, the principal lift may be buoyancy of the aerostats, supplemented by the airfoils when the airship is in transit. This low altitude embodiment relies on the fact that the lifting power of aerostats is 15 to 20 times greater at lower altitudes (hundreds to thousands of feet) than at stratospheric altitudes (tens of thousands of feet) because of the density of air at lower altitudes. The weight of the cargo is distributed throughout the dynastat 1 by the cables of the tetrahedral structure of the central vertical stabilizer. A low altitude, heavy payload version would probably not be solar powered, but rather could be diesel powered, either directly or by electrical generation.

The mode of operation for the low altitude embodiment would differ from that of the high altitude embodiment. In the high altitude embodiment the aerostats would be only partially filled with helium, maintaining a large ballonet filled with air. As the airship ascends, the helium will expand, forcing the air out of the ballonet, until operational altitude is achieved, when the aerostat will be filled, volumetrically, with helium, but at a much lower density than at sea level. In the low altitude embodiment the aerostats would be filled almost completely with helium, with a small ballonet containing ambient air. This maximizes the lift of the aerostats. The payload could be matched to the weight of the airship such that the combined weight would be lighter-than-air and the dynastat 1 could ascend vertically, or if slightly heavier-than-air, require only a short powered runway takeoff.

If the low altitude embodiment were to be used for heavy lift in a remote region (e.g. extraction of forestry products from a forest) sections of the payload pod 140 could be filled with water for ballast during transit to the site, then off loaded gradually as the cargo is brought aboard. In this manner a moderate lighter-than-air configuration can be maintained so the airship can ascend after loading for transit to an unloading point.

It is to be understood that the present invention is not limited to the embodiments described above, but encompasses any and all embodiments within the scope of the following claims.

What is claimed is:

1. A hybrid winged airship (dynastat) comprising:
    a plurality of lighter-than-air (LTA) laminar air flow airships, each airship having a length, a fore end and an aft end, and internal support structures, and
    a plurality of airfoils, each of said airfoils having a length, a first end and a second end, and internal support structures,
        a first of said airships being attached, proximate said fore end, to said first end of a first of said airfoils and proximate said aft end to said first end of a second of said airfoils, and
        a second of said airships being attached, proximate said fore end, to said second end of said first airfoil and at said aft end to said second end of said second airfoil,
        a point of juncture being formed at each connection of said airships and said airfoils,
        said first and second airships being substantially parallel to one another and spaced apart by substantially the length of said airfoils, and
        said first and said second airfoils being substantially parallel to one another and spaced apart by substantially the length of said airships;
    a plurality of outer airfoil segments, each of said outer airfoil segments having a proximal end, and a distal end, a first of said outer airfoil segments joined at said proximal end thereof to said first end of one of said first and second airfoil, extending outboard of said first airship, and a second of said outer airfoil segments joined said the proximal end thereof to said second end of said one of said first and second airfoil, extending outboard of said second airship;
    tensioning means for maintaining rigidity of said dynastat;
    energy acquisition means for acquiring energy for the operation of said dynastat;
    energy storage means for storing acquired energy;
    propulsion means;
    steering means for controlling the direction and attitude of flight of said dynastat;
    sensing means for sensing position, altitude and attitude of said dynastat relative to the earth and the sun;
    controlling means for controlling adjustments in position, altitude and attitude of said dynastat relative to the earth and the sun, and on board payload equipment.

2. A dynastat, as defined in claim 1, wherein said internal support structures of said airfoils and said aerostats are of a light weight composit composition.

3. A dynastat, as defined in claim 1, wherein said plurality of outer airfoil segments further comprises a third and a fourth of said outer airfoil segment joined, one at each end, as an extension of a second of said first and second airfoil, extending outboard of said first and second airship, respectively.

4. A dynastat, as defined in claim 3, wherein each of said outer airfoil segments further comprise a hinged connection with said airfoil such that said outer airfoil may be lowered to a position substantially normal to said airfoil, the distal end of each of said airfoil thereby forming a point of contact for said dynastat when in contact with the ground.

5. A dynastat, as defined in claim 4, wherein said outer airfoil segments further comprise one of the group:
    a lightweight wheel assembly at an end opposite said hinged connection, and
    a skid assembly at an end opposite said hinged connection.

6. A dynastat, as defined in claim 4, wherein said tensioning means comprises:
    a vertical stabilizer normal to and extending through a plane formed by said airships and said airfoils,
        said vertical stabilizer having a height, a lower end and an upper end, and
        said vertical stabilizer being suspended between said airships and said airfoils by
            a plurality of cables, one of said cables extending from each of said lower end and said upper end of said vertical stabilizer to each of said points of juncture of said airfoils and said airships,
        thereby forming a tetrahedral, tensioning structure;
    said lower end of said vertical stabilizer further comprising a point of contact for said winged dynastat when said airship is in contact with the ground.

7. A dynastat, as defined in claim 1, wherein said energy acquisition means comprise at least one of the group:
    solar collection cells, said solar collection cells being adapted for converting energy from a solar source into electrical energy, and
    microwave antennas, said microwave antennas being adapted for receiving radio frequency (RF) waves transmitted from earth based transmitter sources and converting said RF waves into electrical energy.

8. A dynastat, as defined in claim 7, wherein said energy acquisition means is mounted on at least one of the group: outer surfaces of said airfoils and outer surfaces of said airships.

9. A dynastat, as defined in claim 8, wherein said airships may be rotated around a longitudinal axis thereof, thereby adjusting alignment of said energy acquisition means with at least one of the group: the sun and said earth based transmitters.

10. A dynastat, as defined in claim 7, wherein said acquisition means is mounted on at least one of the group: outer surfaces of said airfoils and rotatable arrays within said airships, said rotatable arrays being further mounted on a rotatable central beam, said central beam being coincidental with a longitudinal axis of said airship, the compounded rotation of said arrays and said central beam allowing alignment of said acquisition means with said energy sources.

11. A dynastat, as defined in claim 10, wherein exterior surfaces of said airships are formed of one of the group: transparent materials and highly translucent materials.

12. A dynastat, as defined in claim 1, wherein said energy storage means comprises at least one of the group: storage batteries and fuel cells.

13. A dynastat, as defined in claim 1, wherein said propulsion means comprises at least one electrically powered engine, said at least one engine being mounted on at least one of the group: a forward edge of at least one of said airfoils, a rear edge of at least one of said airfoils, a forward edge of said vertical stabilizer, a rear edge of said vertical stabilizer, said fore end of each of said airships, and said aft end of each of said airships.

14. A dynastat, as defined in claim 13, wherein said engines mounted on said front edge of said airfoils, said front edge of said vertical stabilizer, and said fore ends of said airships are puller engines, and said engines mounted no said rear edges of said airfoils, said rear edge of said vertical stabilizer, and said aft ends of said airships are pusher engines.

15. A dynastat, as defined in claim 14, wherein said steering means comprises at least one of the group:
   variously adjusting said tensioning means, thereby adjusting the center of gravity of said dynastat and creating torque within said dynastat, such that said airship will gradually turn into said center of gravity and said torque, and
   applying varying amounts of electrical energy to selected of said engines such that unequal thrust will cause said airship to gradually turn in the direction of said engines receiving a lesser amount of electrical energy.

16. A dynastat, as defined in claim 1, wherein said sensing means comprises sensors adapted to receive and process input data from at least one source from the group: a solar energy source, a microwave source, a radio frequency (RF) energy source, and a Global Positioning System source.

17. A dynastat, as defined in claim 1, wherein said controlling means comprises an avionics computer programed to receive data from said sensing means, process said data, and controlling operations of at least said tensioning means, said energy acquisition means, said energy storage means, said propulsion means, and said steering means.

18. A dynastat, as defined in claim 1, wherein said airfoils comprise "bi-wing" airfoils for increased dynamic lift.

* * * * *